(12) United States Patent
Kim et al.

(10) Patent No.: US 11,653,533 B2
(45) Date of Patent: May 16, 2023

(54) DISPLAY DEVICE

(71) Applicant: Samsung Display Co., Ltd., Yongin-si (KR)

(72) Inventors: Byungsun Kim, Yongin-si (KR);
Wonkyu Kwak, Yongin-si (KR);
Kyeonghwa Kim, Yongin-si (KR);
Jaewon Kim, Yongin-si (KR);
Hyungjun Park, Yongin-si (KR);
Seungyeon Cho, Yongin-si (KR);
Junwon Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 375 days.

(21) Appl. No.: 16/917,716

(22) Filed: Jun. 30, 2020

(65) Prior Publication Data
US 2021/0091164 A1 Mar. 25, 2021

(30) Foreign Application Priority Data

Sep. 19, 2019 (KR) .................. 10-2019-0115480

(51) Int. Cl.
*G09G 3/3275* (2016.01)
*H01L 27/32* (2006.01)
*G09G 3/3266* (2016.01)

(52) U.S. Cl.
CPC ....... *H01L 27/3276* (2013.01); *G09G 3/3266* (2013.01); *G09G 3/3275* (2013.01)

(58) Field of Classification Search
CPC .. G09G 3/3233; G09G 3/3266; G09G 3/3275;
G09G 2300/0426; G09G 2300/0819;
G09G 2300/0842; G09G 2300/0861;
H01L 27/3244; H01L 27/3276; H01L 51/5203

See application file for complete search history.

(56) References Cited

U.S. PATENT DOCUMENTS

| | | | |
|---|---|---|---|
| 8,797,491 B2 | 8/2014 | Kim et al. | |
| 10,411,083 B2 | 9/2019 | Song et al. | |
| 2012/0206684 A1 | 8/2012 | Lee et al. | |
| 2015/0009438 A1* | 1/2015 | Du | G02F 1/1345 |
| | | | 174/260 |
| 2017/0337873 A1 | 11/2017 | Kim et al. | |

(Continued)

FOREIGN PATENT DOCUMENTS

| | | |
|---|---|---|
| KR | 10-1627245 B1 | 6/2016 |
| KR | 10-1771562 B1 | 8/2017 |

(Continued)

*Primary Examiner* — Stacy Khoo
(74) *Attorney, Agent, or Firm* — Lewis Roca Rothgerber Christie LLP

(57) ABSTRACT

A display device includes: a substrate including a display area and a peripheral area outside the display area, the display area including a first display area and a second display area; a first fan-out portion in a portion of the peripheral area outside the first display area; a second fan-out portion outside the first fan-out portion; a first power supply line in the peripheral area corresponding to one side of the display area and overlapping at least a portion of the first fan-out portion; and a second power supply line in the peripheral area outside the display area and overlapping at least a portion of the second fan-out portion.

13 Claims, 11 Drawing Sheets

(56) References Cited

U.S. PATENT DOCUMENTS

| | | | | |
|---|---|---|---|---|
| 2017/0338295 A1* | 11/2017 | Lee | ..................... | H01L 27/3262 |
| 2018/0075810 A1* | 3/2018 | Kim | ..................... | G09G 3/3266 |
| 2018/0337226 A1* | 11/2018 | Liu | ..................... | H01L 27/3276 |
| 2019/0043418 A1 | 2/2019 | Rieutort-Louis et al. | | |
| 2019/0393295 A1* | 12/2019 | Moy | ................... | H01L 51/5284 |
| 2020/0111988 A1* | 4/2020 | Lee | ..................... | G09G 3/3275 |

FOREIGN PATENT DOCUMENTS

| | | |
|---|---|---|
| KR | 10-2017-0130016 A | 11/2017 |
| KR | 10-2017-0131762 A | 11/2017 |
| KR | 10-2019-0038718 A | 4/2019 |

* cited by examiner

DISPLAY DEVICE

CROSS-REFERENCE TO RELATED APPLICATION

The present application claims priority to and the benefit of Korean Patent Application No. 10-2019-0115480, filed on Sep. 19, 2019, in the Korean Intellectual Property Office, the disclosure of which is incorporated herein in its entirety by reference.

BACKGROUND

1. Field

Aspects of one or more embodiments relate to a display device.

2. Description of Related Art

As the information-oriented society develops, the demand for display devices for displaying various images has increased. In addition, as display devices have become thinner and more lightweight, their range of potential uses has gradually expanded.

To increase a size of a display area in a display device, a so-called dead space may be reduced. To reduce a dead space outside a display area, methods of overlapping wirings arranged in a peripheral area may be utilized.

The above information disclosed in this Background section is only for enhancement of understanding of the background and therefore the information discussed in this Background section does not necessarily constitute prior art.

SUMMARY

Aspects of one or more embodiments relate to a display device, and for example, to a display device with a reduced dead space.

In a display device according to the related art, a dead space in a corner portion may be wider than a dead space in a straight line portion.

Aspects of one or more example embodiments include a display device in which a dead space in a corner portion is minimized or reduced. However, it should be understood that embodiments described herein should be considered in a descriptive sense only and not for limitation of the disclosure.

Additional aspects will be set forth in part in the description which follows and, in part, will be apparent from the description, or may be learned by practice of the presented embodiments of the disclosure.

According to some example embodiments, a display device includes a substrate including a display area and a peripheral area outside the display area, the display area including a first display area and a second display area, a first fan-out portion in a portion of the peripheral area outside the first display area, a second fan-out portion outside the first fan-out portion, a first power supply line arranged in the peripheral area so as to correspond to one side of the display area and overlapping at least a portion of the first fan-out portion, and a second power supply line arranged in the peripheral area outside the display area and overlapping at least a portion of the second fan-out portion.

According to some example embodiments, the display device may further include a driving circuit arranged between the first fan-out portion and the second fan-out portion so as to correspond to the first display area, and arranged between second display area and the second fan-out portion so as to correspond to the second display area.

According to some example embodiments, the driving circuit may include a first sub-driving circuit and a second sub-driving circuit each arranged between the first fan-out portion and the second fan-out portion and corresponding to the first display area, and the first sub-driving circuit and the second sub-driving circuit may be spaced apart from each other by a first distance.

According to some example embodiments, the driving circuit may include a third sub-driving circuit and a fourth sub-driving circuit each arranged between the second display area and the second fan-out portion and corresponding to the second display area, and the third sub-driving circuit and the fourth sub-driving circuit may be spaced apart from each other by a second distance less than the first distance.

According to some example embodiments, the first fan-out portion may include a first fan-out line and a second fan-out line respectively arranged on different layers over the substrate, and the first fan-out line and the second fan-out line may be alternately arranged.

According to some example embodiments, the second fan-out portion may include a third fan-out line and a fourth fan-out line respectively arranged on different layers over the substrate, and the third fan-out line and the fourth fan-out line may be alternately arranged.

According to some example embodiments, the third fan-out line may pass between the third sub-driving circuit and the fourth sub-driving circuit.

According to some example embodiments, the display device may further include a plurality of pixels arranged in the display area, wherein the first power supply line may provide a first power voltage to the plurality of pixels.

According to some example embodiments, the second power supply line may provide a second power voltage to the plurality of pixels.

According to some example embodiments, the display device may further include a plurality of first data lines arranged in the first display area and extending in a first direction, wherein the first fan-out line and the second fan-out line may be connected to the plurality of first data lines and may provide a data signal to the plurality of pixels.

According to some example embodiments, the display device may further include a plurality of second data lines arranged in the second display area and extending in the first direction, wherein the third fan-out line and the fourth fan-out line may be connected to the plurality of second data lines and may provide a data signal to the plurality of pixels.

According to some example embodiments, the display device may further include a plurality of scan lines arranged in the display area and extending in a second direction intersecting the first direction, wherein the driving circuit may transfer a scan signal to each pixel through the plurality of scan lines.

According to some example embodiments, the display device may further include a thin film transistor including a semiconductor layer, a gate electrode, a source electrode, and a drain electrode, the gate electrode being insulated from the semiconductor layer, and the source electrode and the drain electrode being insulated from the gate electrode, wherein the first fan-out line may include same material as that of the gate electrode, and the first power supply line may include same material as that of the source electrode.

According to some example embodiments, the display device may further include a storage capacitor including a bottom electrode and a top electrode on the bottom electrode, wherein the first fan-out line may include same material as that of the bottom electrode or the top electrode.

According to some example embodiments, the display area may include a round-type corner portion.

According to some example embodiments, a display device includes a substrate including a display area and a peripheral area outside the display area, the display area including a first display area and a second display area, a first fan-out portion arranged in the peripheral area outside the first display area and including a first fan-out line and a second fan-out line, a second fan-out portion arranged outside the first fan-out portion and including a third fan-out line and a fourth fan-out line, a first power supply line overlapping at least a portion of the first fan-out line and arranged over the first fan-out line, and a second power supply line overlapping at least a portion of the third fan-out line and arranged over the third fan-out line.

According to some example embodiments, the display device may further include a driving circuit arranged between the first fan-out portion and the second fan-out portion so as to correspond to the first display area, and arranged between second display area and the second fan-out portion so as to correspond to the second display area.

According to some example embodiments, the driving circuit may include a first sub-driving circuit and a second sub-driving circuit each arranged between the first fan-out portion and the second fan-out portion and corresponding to the first display area, and the first sub-driving circuit and the second sub-driving circuit may be spaced apart from each other by a first distance.

According to some example embodiments, the driving circuit may include a third sub-driving circuit and a fourth sub-driving circuit each arranged between the second display area and the second fan-out portion and corresponding to the second display area, and the third sub-driving circuit and the fourth sub-driving circuit may be spaced apart from each other by a second distance less than the first distance.

According to some example embodiments, the first fan-out line and the second fan-out line may be respectively arranged on different layers over the substrate, and the third fan-out line and the fourth fan-out line may be respectively arranged on different layers over the substrate.

The above and other aspects, features, and characteristics of certain embodiments of the disclosure will be more apparent from the following description, the accompanying drawings, and claims.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
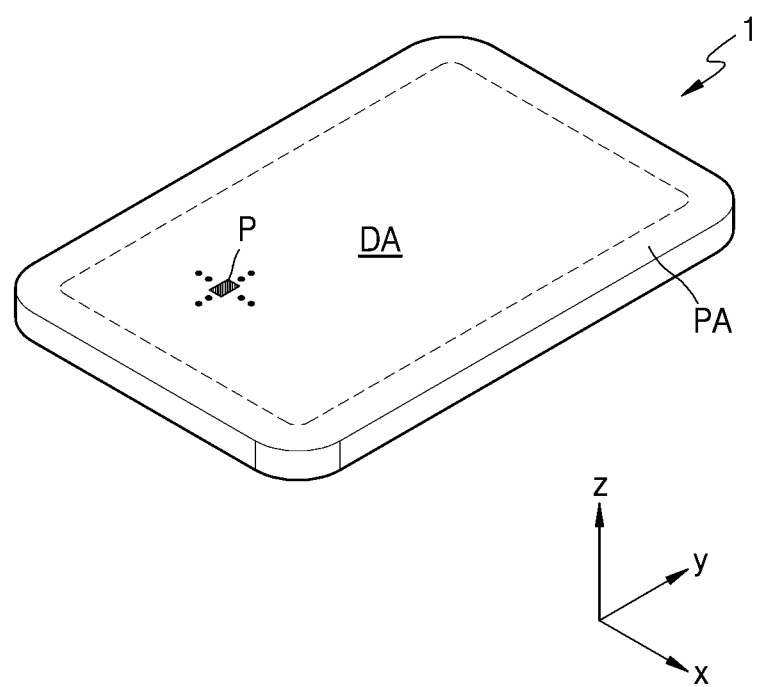
FIG. 1 is a perspective view of a display device according to some example embodiments.

Reference will now be made in more detail to aspects of some example embodiments, which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

Hereinafter, the present embodiments are described in more detail with reference to the accompanying drawings. In the drawings, the same reference numerals are given to the same or corresponding elements, and repeated description thereof is omitted.

It will be understood that although the terms "first," "second," etc. may be used herein to describe various components, these components should not be limited by these terms. These components are only used to distinguish one component from another. As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components. It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, because sizes and thicknesses of components in the drawings are arbitrarily illustrated for convenience of explanation, the following embodiments are not limited thereto.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

FIG. 1 is a perspective view of a display device 1 according to some example embodiments.

Referring to FIG. 1, the display device 1 may include a display area DA on which an image is displayed, and a peripheral area PA on which an image is not displayed. The display device 1 may display an image by using light emitted from a plurality of pixels P arranged in the display area DA. An image is not displayed on the peripheral area PA. The peripheral area PA may be an area outside the display area DA.

Hereinafter, though the display device 1 according to some example embodiments is described as an organic light-emitting display device as an example, a display device according to embodiments of the present disclosure is not limited thereto. According to some example embodiments, the display device 1 may be various ones, for example, an inorganic light-emitting display and a quantum dot light-emitting display. For example, an emission layer of a display element provided to the display device 1 may include an organic material, an inorganic material, quantum dots, an organic material and quantum dots, or an inorganic material and quantum dots.

Though FIG. 1 shows the display device 1 having a flat display surface, the embodiments are not limited thereto. According to some example embodiments, the display device 1 may include a three-dimensional display surface or a curved display surface.

In the case where the display device 1 includes a three-dimensional display surface, the display device 1 may include a plurality of display areas each indicating different directions, for example, include a polyprism-type display surface. According to some example embodiments, in the case where the display device 1 includes a curved display surface, the display device 1 may be implemented as various types such as flexible, foldable, and rollable display devices.

Also, according to some example embodiments, FIG. 1 shows the display device 1 applicable to a mobile phone terminal. According to some example embodiments, electronic modules, a camera module, a power module, etc. mounted on a mainboard are arranged on a bracket/case together with the display device 1 to constitute a mobile phone terminal. The display device 1 according to some example embodiments is applicable to large-scale electronic devices such as televisions, monitors, and medium and small-scale electronic devices such as tablet devices, navigation devices for an automobile, game consoles, and smart-watches.

Though FIG. 1 shows the case where the display area DA of the display device 1 is a quadrangle, a shape of the display area DA may be a circle, an ellipse, or a polygon such as a triangle or a pentagon according to some example embodiments.

Figure 2:
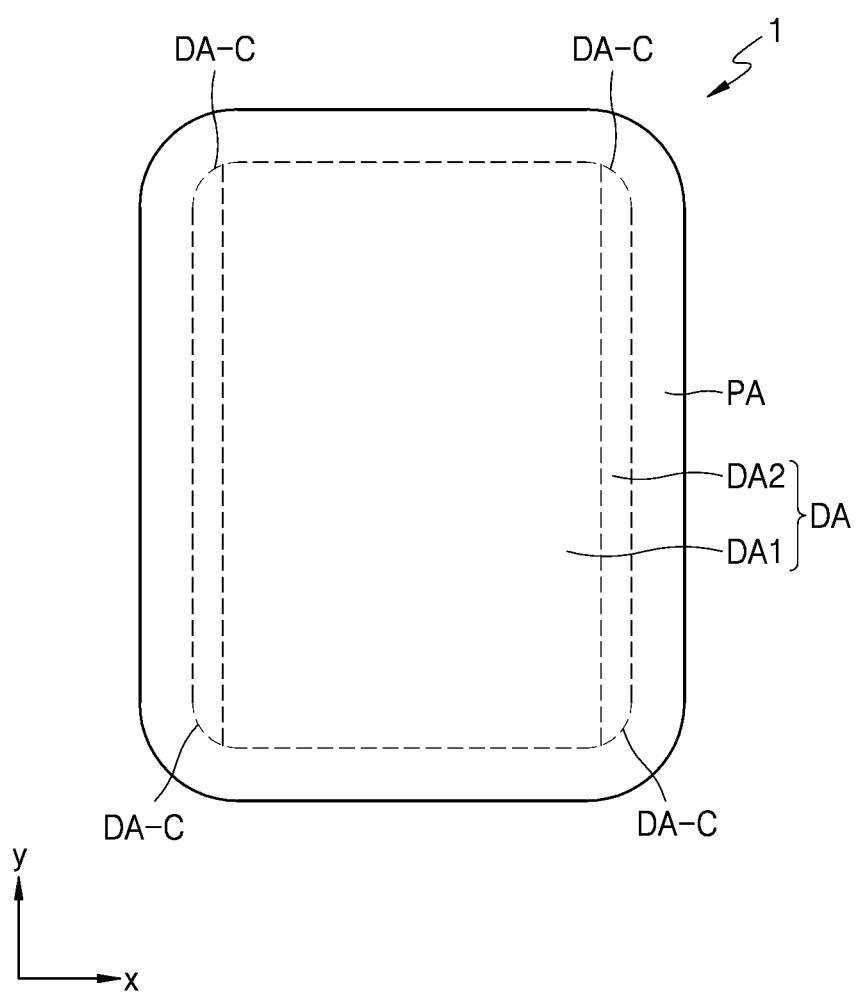
FIGS. 2 and 3 are plan views of a display device according to some example embodiments.
Figure 3:
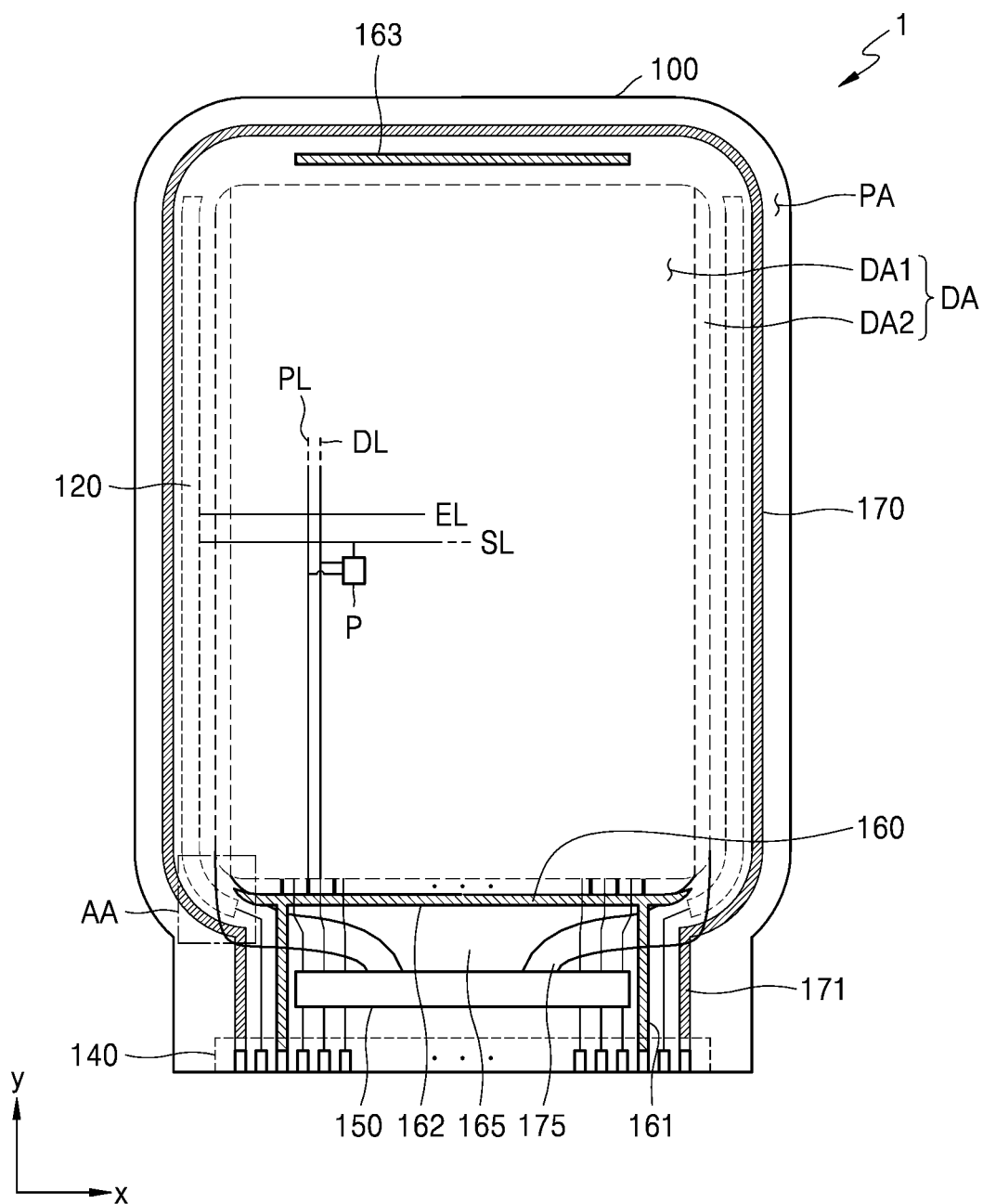

FIGS. 2 and 3 are plan views of the display device 1 according to some example embodiments.

Referring to FIG. 2, the display area DA of the display device 1 according to some example embodiments may include a first display area DA1 and a second display area DA2. Also, four corner portions DA-C of the display area DA may have a round shape having a curvature (e.g., a set or predetermined curvature). The peripheral area PA may surround the display area DA. However, the shapes of the display area DA and the peripheral area PA may be designed relative.

Referring to FIG. 3, the display device 1 may include a plurality of pixels P arranged in the display area DA. Each of the plurality of pixels P may include a display element such as an organic light-emitting diode OLED. Each pixel P may emit, for example, red, green, blue, or white light from an organic light-emitting diode OLED. In the present specification, a pixel P may be a pixel that emits red, green, blue, or white light as described above. The display area DA may be protected from external air or moisture by being covered by a thin-film encapsulation layer TFE (see, e.g., FIG. 7).

Each pixel P may be electrically connected to outer circuits arranged in the peripheral area PA. A driving circuit 120, a pad unit 140, a data driving circuit 150, a first power supply line 160, and a second power supply line 170 may be arranged in the peripheral area PA.

The driving circuit 120 may provide a scan signal to each pixel P through a scan line SL, and provide an emission control signal to each pixel through an emission control line EL. The driving circuit 120 may be provided on the left and right with the display area DA therebetween. Some of the plurality of pixels P arranged in the display area DA may be electrically connected to at least one of the driving circuits 120 provided on the left and right of the display area DA.

The pad unit 140 may be arranged on one side or edge of a substrate 100. The pad unit 140 may be exposed and electrically connected to a printed circuit board PCB by not being covered by an insulating layer. A pad unit of the printed circuit board PCB may be electrically connected to the pad unit 140 of the display device 1. The printed circuit board PCB may transfer a signal of a controller or power to the display device 1.

Control signals generated by the controller may be respectively transferred to the driving circuits 120 on the left and right of the display area DA through the printed circuit board PCB. The controller may provide a first power voltage to the first power supply line 160 through a first connection line 161 and provide a second power voltage to the second power supply line 170 through a second connection line 171.

The first power voltage may be provided to each pixel P through a driving voltage line PL connected to the first power supply line 160, and the second power voltage may be provided to an opposite electrode of each pixel P connected to the second power supply line 170. The driving voltage line PL may extend in a first direction (a y-direction). For example, the first power voltage may include a driving voltage ELVDD, and the second power voltage may include a common voltage ELVSS.

The data driving circuit 150 is electrically connected to a data line DL. A data signal of the data driving circuit 150 may be provided to each pixel P through a connection line connected to the pad unit 140 and the data line DL connected to the connection line. Though it is shown in FIG. 3 that the data driving circuit 150 is arranged between the first power supply line 160 and the pad unit 140 over the substrate 100, the data driving circuit 150 may be arranged on the printed circuit board PCB according to some example embodiments.

The first power supply line 160 may include a first sub-line 162 and a second sub-line 163 that are parallel to each other with the display area DA therebetween and extending in a second direction (an x-direction). The second power supply line 170 may have a loop shape having one open side and partially surround the display area DA.

Figure 4:
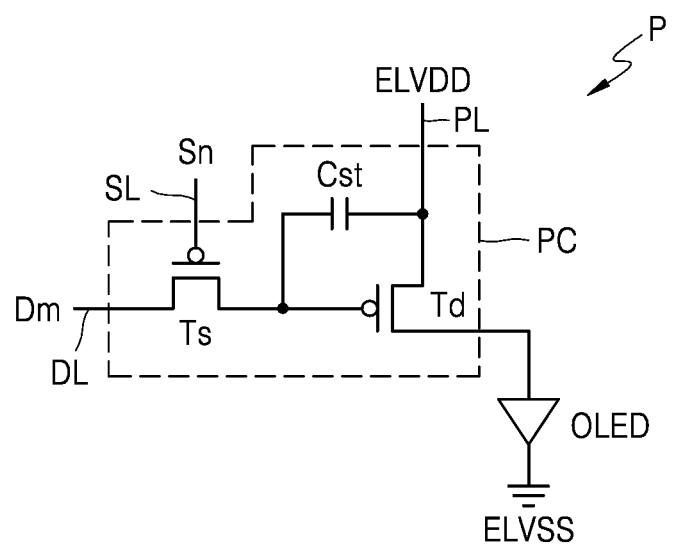
FIGS. 4 and 5 are equivalent circuit diagrams of a pixel that may be included in a display device according to some example embodiments.
Figure 5:
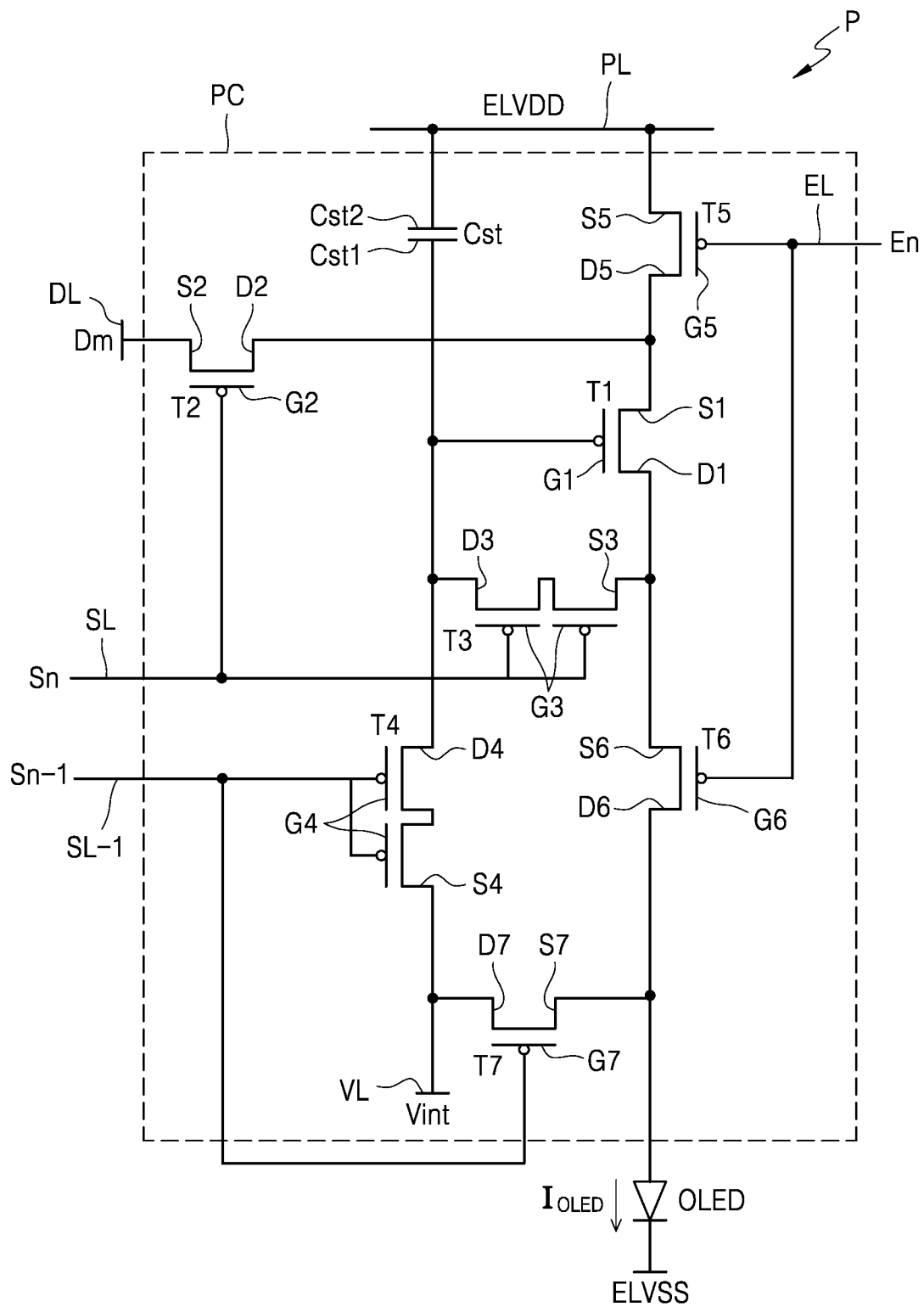

FIGS. 4 and 5 are equivalent circuit diagrams of a pixel that may be included in the display device 1 according to some example embodiments.

Referring to FIG. 4, each pixel P may include a pixel circuit PC and an organic light-emitting diode OLED connected to the pixel circuit PC, the pixel circuit PC being connected to a scan line SL and a data line DL. The pixel circuit PC may include a driving thin film transistor Td, a switching thin film transistor Ts, and a storage capacitor Cst. The switching thin film transistor Ts is connected to the scan line SL and the data line DL and may transfer a data signal Dm input through the data line DL to the driving thin film transistor Td, in response to a scan signal Sn input through the scan line SL.

The storage capacitor Cst is connected to the switching thin film transistor Ts and the driving voltage line PL and may store a voltage corresponding to a difference between a voltage transferred from the switching thin film transistor Ts and the first power voltage supplied to the driving voltage line PL.

The driving thin film transistor Td is connected to the driving voltage line PL and the storage capacitor Cst and may control a driving current flowing through the organic light-emitting diode OLED from the driving voltage line PL, in response to the voltage stored in the storage capacitor Cst. The organic light-emitting diode OLED may emit light having a brightness (e.g., a set or predetermined brightness) by using the driving current.

Though it is shown in FIG. 4 that the pixel circuit PC includes two thin film transistors and one storage capacitor, embodiments according to the present disclosure are not limited thereto. For example, as shown in FIG. 5, the pixel circuit PC may include seven thin film transistors and one storage capacitor. Though it is shown in FIG. 5 that the pixel circuit PC includes one storage capacitor, the pixel circuit PC may include two or more storage capacitors.

Referring to FIG. 5, a pixel P includes the pixel circuit PC and the organic light-emitting diode OLED connected to the pixel circuit PC. The pixel circuit PC may include a plurality of thin film transistors and a storage capacitor. The thin film transistors and the storage capacitor may be connected to signal lines SL, SL-1, EL, and DL, an initialization voltage line VL, and the driving voltage line PL.

Though it is shown in FIG. 5 that the pixel P is connected to the signal lines SL, SL-1, EL, and DL, the initialization voltage line VL, and the driving voltage line PL, the embodiments are not limited thereto. According to some example embodiments, at least one of the signal lines SL, SL-1, EL, or DL, the initialization voltage line VL, or the driving voltage line PL may be shared by pixels that neighbor each other.

The signal lines include the scan line SL, a previous scan line SL-1, the emission control line EL, and the data line DL, the scan line SL transferring a scan signal Sn, the previous scan line SL-1 transferring a previous scan signal Sn-1 to a first initialization thin film transistor T4 and a second initialization thin film transistor T7, the emission control line EL transferring an emission control signal En to an operation control thin film transistor T5 and an emission control thin film transistor T6, and the data line DL intersecting with the scan line SL and transferring a data signal Dm. The driving voltage line PL transfers a driving voltage to a driving thin film transistor T1, and the initialization voltage line VL transfers an initialization voltage Vint initializing the driving thin film transistor T1 and a pixel electrode of the organic light-emitting diode OLED. Thus, as illustrated in FIG. 5, according to some example embodiments, the gate electrode of the driving thin film transistor T1, and a pixel electrode of the organic light-emitting diode OLED may be configured to be initialized by receiving an initialization voltage Vint in response to the previous scan signal Sn-1 turning on transistors T4 and T7.

A driving gate electrode G1 of the driving thin film transistor T1 is connected to a bottom electrode Cst1 of the storage capacitor Cst, a driving source electrode S1 of the driving thin film transistor T1 is connected to the driving voltage line PL through the operation control thin film transistor T5, and a driving drain electrode D1 of the driving thin film transistor T1 is electrically connected to a pixel electrode of a organic light-emitting diode OLED through the emission control thin film transistor T6. The driving thin film transistor T1 receives a data signal Dm depending on a switching operation of a switching thin film transistor T2 and may supply a driving current $I_{OLED}$ to the organic light-emitting diode OLED.

A switching gate electrode G2 of the switching thin film transistor T2 is connected to the scan line SL, a switching source electrode S2 of the switching thin film transistor T2 is connected to the data line DL, and a switching drain electrode D2 of the switching thin film transistor T2 is connected to the driving source electrode S1 of the driving thin film transistor T1 and concurrently (or simultaneously) connected to the driving voltage line PL through the operation control thin film transistor T5. The switching thin film transistor T2 is turned on in response to a scan signal Sn transferred through the scan line SL and may perform a switching operation of transferring a data signal Dm transferred through the data line DL to the driving source electrode S1 of the driving thin film transistor T1.

A compensation gate electrode G3 of a compensation thin film transistor T3 is connected to the scan line SL, a compensation source electrode S3 of the compensation thin film transistor T3 is connected to the driving drain electrode D1 of the driving thin film transistor T1 and concurrently (or simultaneously) connected to the pixel electrode of the organic light-emitting diode OLED through the emission control thin film transistor T6, and a compensation drain electrode D3 of the compensation thin film transistor T3 is connected to the bottom electrode Cst1 of the storage capacitor Cst, a first initialization drain electrode D4 of the first initialization thin film transistor T4, and the driving gate electrode G1 of the driving thin film transistor T1. The compensation thin film transistor T3 is turned on in response to a scan signal Sn transferred through the scan line SL and may diode-connect the driving thin film transistor T1 by electrically connecting the driving gate electrode G1 to the driving drain electrode D1 of the driving thin film transistor T1.

A first initialization gate electrode G4 of the first initialization thin film transistor T4 is connected to the previous scan line SL-1, a first initialization source electrode S4 of the first initialization thin film transistor T4 is connected to a second initialization drain electrode D7 of the second initialization thin film transistor T7 and the initialization voltage line VL, and a first initialization drain electrode D4 of the first initialization thin film transistor T4 is connected to the bottom electrode Cst1 of the storage capacitor Cst, the compensation drain electrode D3 of the compensation thin film transistor T3, and the driving gate electrode G1 of the driving thin film transistor T1. The first initialization thin film transistor T4 is turned on in response to a previous scan signal Sn-1 transferred through the previous scan line SL-1 and may perform an initialization operation of transferring an initialization voltage Vint to the driving gate electrode G1 of the driving thin film transistor T1, thereby initializing a voltage of the driving gate electrode G1 of the driving thin film transistor T1.

An operation control gate electrode G5 of the operation control thin film transistor T5 is connected to the emission control line EL, an operation control source electrode S5 of the operation control thin film transistor T5 is connected to the driving voltage line PL, and an operation control drain electrode D5 of the operation control thin film transistor T5 is connected to the driving source electrode S1 of the driving thin film transistor T1 and the switching drain electrode D2 of the switching thin film transistor T2.

An emission control gate electrode G6 of the emission control thin film transistor T6 is connected to the emission control line EL, an emission control source electrode S6 of the emission control thin film transistor T6 is connected to the driving drain electrode D1 of the driving thin film transistor T1 and the compensation source electrode S3 of the compensation thin film transistor T3, and an emission control drain electrode D6 of the emission control thin film transistor T6 is connected to the second initialization source electrode S7 of the second initialization thin film transistor T7 and the pixel electrode of the organic light-emitting diode OLED.

The operation control thin film transistor T5 and the emission control thin film transistor T6 are concurrently (or simultaneously) turned on in response to an emission control signal En transferred through the emission control line EL to allow the a driving voltage ELVDD to be transferred to the organic light-emitting diode OLED and thus the driving current $I_{OLED}$ to flow through the organic light-emitting diode OLED.

A second initialization gate electrode G7 of the second initialization thin film transistor T7 is connected to the previous scan line SL-1, the second initialization source electrode S7 of the second initialization thin film transistor T7 is connected to the emission control drain electrode D6 of the emission control thin film transistor T6 and the pixel electrode of the organic light-emitting diode OLED, and the second initialization drain electrode D7 of the second initialization thin film transistor T7 is connected to the first initialization source electrode S4 of the first initialization thin film transistor T4 and the initialization voltage line VL. The second initialization thin film transistor T7 is turned on in response to a previous scan signal Sn-1 transferred through the previous scan line SL-1 and may initialize the pixel electrode of the organic light-emitting diode OLED.

Though FIG. 5 shows the case where the first initialization thin film transistor T4 and the second initialization thin film transistor T7 are connected to the previous scan line SL-1, the embodiments are not limited thereto. According to some example embodiments, the first initialization thin film transistor T4 may be connected to the previous scan line SL-1 and driven in response to a previous scan signal Sn-1, and the second initialization thin film transistor T7 may be connected to a separate signal line (for example, the next scan line) and driven in response to a signal transferred through the separate signal line.

A top electrode Cst2 of the storage capacitor Cst is connected to the driving voltage line PL, and an opposite electrode of the organic light-emitting diode OLED is connected to the common voltage. Therefore, the organic light-emitting diode OLED may receive the driving current $I_{OLED}$ from the driving thin film transistor T1 and emit light to thereby display an image.

Though it is shown in FIG. 5 that the compensation thin film transistor T3 and the first initialization thin film transistor T4 each have a dual gate electrode, the compensation thin film transistor T3 and the first initialization thin film transistor T4 each may have one gate electrode.

Figure 6:
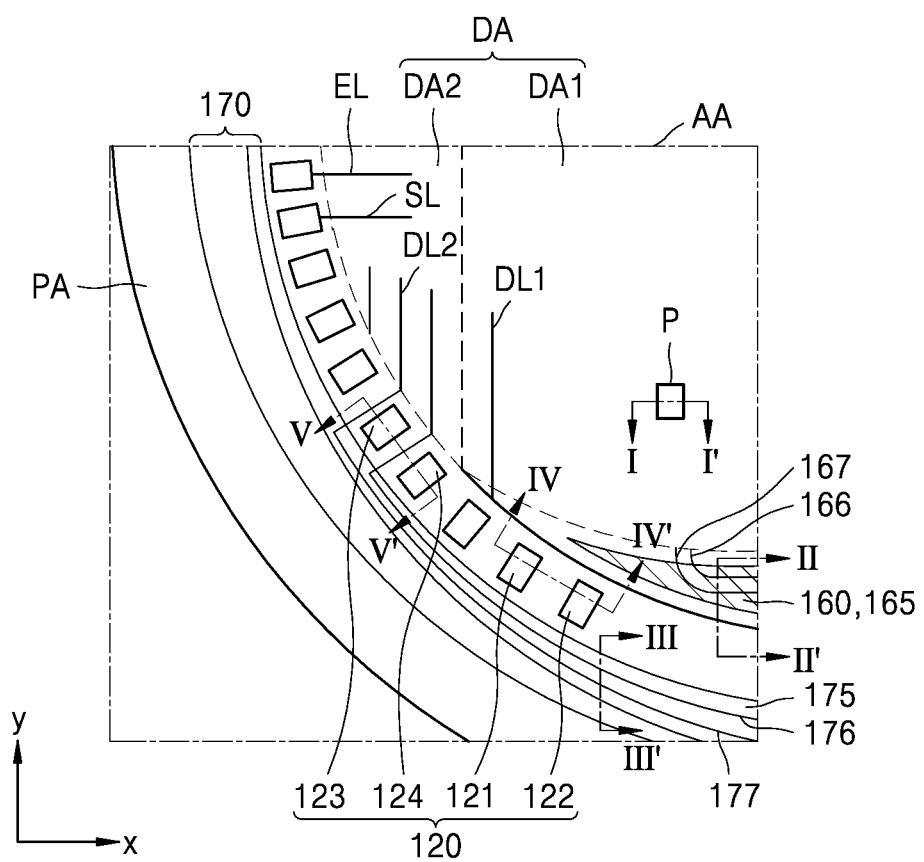
FIG. 6 is a plan view of a display device according to some example embodiments.

FIG. 6 is a plan view of the display device 1 according to an embodiment. For example, FIG. 6 is an enlarged view of a region AA of a round corner portion DA-C of the display area DA in the display device 1 according to an embodiment. Though it is shown in FIG. 6 that a first fan-out portion 165 includes a first fan-out line 166 and a second fan-out line 167, the first fan-out portion 165 may include a plurality of fan-out lines. Also, though it is shown in FIG. 6 that a second fan-out portion 175 includes a third fan-out line 176 and a fourth fan-out line 177, the second fan-out portion 175 may include a plurality of fan-out lines.

According to some example embodiments, the display device 1 may include a substrate 100 including the display area DA and the peripheral area PA outside the display area DA, the display area DA including the first display area DA1 and the second display area DA2, the first fan-out portion 165, the second fan-out portion 175, the first fan-out portion 165 being arranged in a portion of the peripheral area PA outside the first display area DA1, and the second fan-out portion 175 being arranged outside the first fan-out portion 165, the first power supply line 160, and the second power supply line 170, the first power supply line 160 being arranged in the peripheral area PA corresponding to one side of the display area DA and overlapping a portion of the first fan-out portion 165, and the second power supply line 170 being arranged in the peripheral area PA outside the display area DA and overlapping at least a portion of the second fan-out portion 175.

The driving circuit 120 may be arranged between the first fan-out portion 165 and the second fan-out portion 175 corresponding to the first display area DA1 and may be arranged between the second display area DA2 and the second fan-out portion 175 corresponding to the second display area DA2. The driving circuit 120 may include a first sub-driving circuit 121 and a second sub-driving circuit 122 each arranged between the first fan-out portion 165 and the second fan-out portion 175 and corresponding to the first display area DA1, the first sub-driving circuit 121 being apart from the second sub-driving circuit 122. The driving circuit 120 may include a third sub-driving circuit 123 and a fourth sub-driving circuit 124 each arranged between the second display area DA2 and the second fan-out portion 175 and corresponding to the second display area DA2, the third sub-driving circuit 123 being apart from the fourth sub-driving circuit 124.

According to some example embodiments, the first sub-driving circuit 121 may be spaced apart from the second sub-driving circuit 122 between the first fan-out portion 165 and the second fan-out portion 175 corresponding to the first display area DA1. The first sub-driving circuit 121 may be spaced apart from the second sub-driving circuit 122. The second sub-driving circuit 122 may be spaced apart from the first sub-driving circuit 121. For example, the first sub-driving circuit 121 and the second sub-driving circuit 122 may be repeatedly apart from each other. Also, like the first sub-driving circuit 121 and the second sub-driving circuit 122, the third sub-driving circuit 123 and the fourth sub-driving circuit 124 may be repeatedly apart from each other between the second display area DA2 and the second fan-out portion 175 corresponding to the second display area DA2.

The sub-driving circuits corresponding to the second display area DA2 and included in the driving circuit 120 arranged in the peripheral area PA may be spaced apart from each other. The sub-driving circuits corresponding to the first display area DA1 and included in the driving circuit 120 arranged in the peripheral area PA may be spaced apart from each other. Separation intervals of the sub-driving circuits may gradually increase toward the peripheral area PA corresponding to the first display area DA1 from the peripheral area PA corresponding to the second display area DA2.

The plurality of scan lines SL may be arranged in the display area DA and may extend in the second direction (the x-direction) intersecting the first direction (the y-direction). The driving circuit 120 may transfer a scan signal to each pixel through the plurality of scan lines SL and transfer an emission control signal to each pixel through the plurality of emission control lines EL.

The first power supply line 160 may be connected to each pixel through the driving voltage line PL and may provide the first power voltage to the pixels, and the second power supply line 170 may be connected to each pixel and may provide the second power voltage to the pixels. In this case, the first power voltage may include a driving voltage ELVDD, and the second power voltage may include a common voltage ELVSS.

The first fan-out portion 165 may include the first fan-out line 166 and the second fan-out line 167, and the second fan-out portion 175 may include the third fan-out line 176 and the fourth fan-out line 177.

As shown in FIG. 6, the third fan-out line 176 may pass between the third sub-driving circuit 123 and the fourth sub-driving circuit 124. Though it is shown in FIG. 6 that the third fan-out line 176 passes between the third sub-driving circuit 123 and the fourth sub-driving circuit 124, the embodiments are not limited thereto. A plurality of fan-out lines connected to a plurality of second data lines DL2 arranged in the second display area DA2 may pass between a plurality of sub-driving circuits arranged between the second display area DA2 and the second fan-out portion 175 and apart from each other. A plurality of fan-out lines connected to a plurality of first data lines DL1 arranged in the first display area DA1 may pass between a plurality of sub-driving circuits arranged between the first display area DA1 and the second display area DA2 and apart from each other.

According to some example embodiments, the display device 1 may include the plurality of first data lines DL1 arranged in the first display area DA1 and extending in the first direction (the y-direction). The first fan-out line 166 and the second fan-out line 167 may provide a data signal to the pixels through the plurality of first data lines DL1. Also, the display device 1 may include the plurality of second data lines DL2 arranged in the second display area DA2 and extending in the first direction (the y-direction). The third fan-out line 176 and the fourth fan-out line 177 may provide a data signal to the pixels through the plurality of second data lines DL2.

Figure 7:
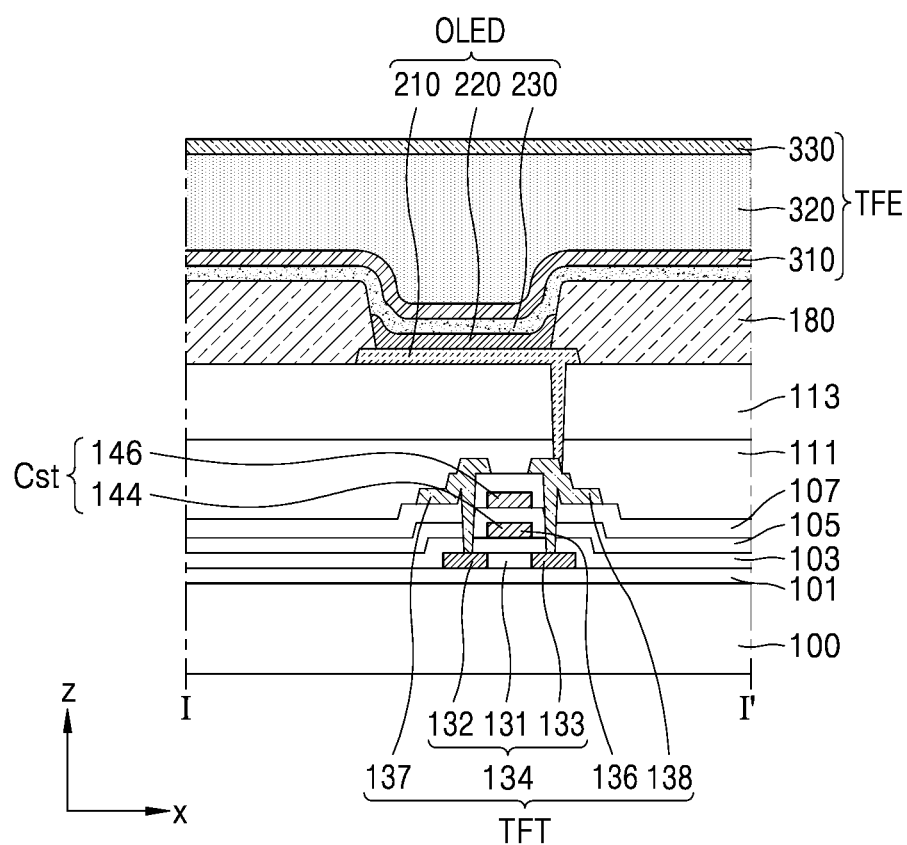
FIG. 7 is a cross-sectional view of the display device taken along the line I-I' of FIG. 6.

FIG. 7 is a cross-sectional view of the display device 1 taken along the line I-I' of FIG. 6. For example, FIG. 7 is a view for explaining a stacking sequence of one pixel of the display device 1 according to an embodiment.

Referring to FIG. 7, the display device 1 according to some example embodiments may include the substrate 100, a thin film transistor TFT arranged over the substrate 100, the organic light-emitting diode OLED, and the thin-film encapsulation layer TFE, the organic light-emitting diode OLED being connected to the thin film transistor TFT and being arranged over the thin film transistor TFT, and the thin-film encapsulation layer TFE being arranged on the organic light-emitting diode OLED.

The substrate 100 may include glass or a polymer resin. The polymer resin may include a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. The substrate 100 including the polymer resin may be flexible, rollable, or bendable. The substrate 100 may have a multi-layered structure including a layer including the above polymer resin and an inorganic layer. According to some example embodiments, the substrate 100 may include a flexible substrate.

The buffer layer 101 is located on the substrate 100, may reduce or block the penetration of foreign substances, moisture, or external air from below the substrate 100, and provide a flat surface on the substrate 100. The buffer layer 101 may include an inorganic material such as an oxide or a nitride, an organic material, or an organic/inorganic composite material and include a single layer or a multi-layer including an inorganic material and an organic material. A barrier layer blocking the penetration of external air may be further arranged between the substrate 100 and the buffer layer 101. The buffer layer 101 may be arranged over the display area DA and the peripheral area PA.

The thin film transistor TFT, the storage capacitor Cst, and the organic light-emitting diode OLED may be arranged over the substrate 100, the thin film transistor TFT being provided at a location corresponding to the display area DA, and the organic light-emitting diode OLED being electrically connected to the thin film transistor TFT and the storage capacitor Cst. The thin film transistor TFT of FIG. 7 may correspond to one of the thin film transistors of the pixel circuit PC described with reference to FIG. 5, for example, the driving thin film transistor T1.

The thin film transistor TFT may include a semiconductor layer 134, a gate electrode 136, a source electrode 137, and a drain electrode 138. The semiconductor layer 134 may include a channel region 131, a source region 132, and a drain region 133, the channel region 131 overlapping the gate electrode 136, and the source region 132 and the drain region 133 being arranged on two opposite sides of the channel region 131 and including impurities having a concentration higher than that of the channel region 131. Here, the impurities may include N-type impurities or P-type impurities. The source region 132 and the drain region 133 may be electrically respectively connected to the source electrode 137 and the drain electrode 138 of the thin film transistor TFT.

The semiconductor layer 134 may include an oxide semiconductor and/or a silicon semiconductor. In the case where the semiconductor layer 134 includes an oxide semiconductor, the semiconductor layer 134 may include, for example, an oxide of at least one of indium (In), gallium (Ga), stannum (Sn), zirconium (Zr), vanadium (V), hafnium (Hf), cadmium (Cd), germanium (Ge), chrome (Cr), titanium (Ti), and zinc (Zn). For example, the semiconductor layer 134 may include ITZO (InSnZnO), IGZO (InGaZnO), etc. In the case where the semiconductor layer 134 includes a silicon semiconductor, the semiconductor layer 134 may include, for example, amorphous silicon (a-Si) or low temperature polycrystalline silicon (LTPS) in which amorphous silicon (a-Si) is crystallized.

The gate electrode 136 may include a single layer or a multi-layer including at least one metal among aluminum (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybdenum (Mo), titanium (Ti), tungsten (W), and copper (Cu). The gate electrode 136 may be connected to a gate line applying an electric signal to the gate electrode 136. According to some example embodiments, the gate electrode 136 may include the same material as those of the first fan-out line 166, the second fan-out line 167, the third fan-out line 176, and the fourth fan-out line 177.

Because a gate insulating layer 103 is arranged between the semiconductor layer 134 and the gate electrode 136, the semiconductor layer 134 may be insulated from the gate electrode 136. The gate insulating layer 103 may include at least one inorganic insulating material including silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The gate insulating layer 103 may include a single layer or a multi-layer including the above inorganic insulating materials.

The storage capacitor Cst may include a bottom electrode 144 and a top electrode 146 over the bottom electrode 144. The bottom electrode 144 of the storage capacitor Cst may overlap the top electrode 146 of the storage capacitor Cst. According to some example embodiments, the first fan-out line 166, the second fan-out line 167, the third fan-out line 176, and the fourth fan-out line 177 may include the same material as that of the bottom electrode 144 or the top electrode 146 and may be arranged on the same layer as a layer on which the bottom electrode 144 or the top electrode 146 is arranged.

A first interlayer insulating layer 105 may be arranged between the bottom electrode 144 and the top electrode 146. The first interlayer insulating layer 105 is a layer having a dielectric constant (e.g., a set or predetermined dielectric constant), may include an inorganic insulating layer including silicon oxynitride (SiON), silicon oxide ($SiO_x$), and/or silicon nitride ($SiN_x$), and may include a single layer or a multi-layer.

Though it is shown in FIG. 7 that the storage capacitor Cst overlaps the thin film transistor TFT, and the bottom electrode 144 is one body with the gate electrode 136 of the thin film transistor TFT, the storage capacitor Cst may not overlap the thin film transistor TFT and the bottom electrode 144 may be a separate element independent of the gate electrode 136 of the thin film transistor TFT in an embodiment.

A second interlayer insulating layer 107 may be arranged on the top electrode 146 of the storage capacitor Cst. The second interlayer insulating layer 107 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$) and may include a single layer or a multi-layer.

The source electrode 137 and the drain electrode 138 may be arranged on the second interlayer insulating layer 107. The source electrode 137 and the drain electrode 138 may include a conductive material including molybdenum (Mo), aluminum (Al), copper (Cu), or titanium (Ti) and may include a single layer or a multi-layer including the above materials. Each of the source electrode 137 and the drain electrode 138 may include a stacked structure of Ti/Al/Ti. According to some example embodiments, the source electrode 137 and the drain electrode 138 may include the same material as those of the first power supply line 160 and the second power supply line 170.

A first planarization layer 111 and a second planarization layer 113 may be arranged on the source electrode 137 and the drain electrode 138. The first planarization layer 111 and the second planarization layer 113 may planarize a top surface of the pixel circuit PC to planarize a surface on which the organic light-emitting diode OLED is to be located.

The first planarization layer 111 and the second planarization layer 113 may include a general-purpose polymer such as benzocyclobutene (BCB), polyimide, hexamethyldisiloxane (HMDSO), polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof. The first planarization layer 111 and the second planarization layer 113 may include an inorganic material. The first planarization layer 111 and the second planarization layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). In the case where the first planarization layer 111 and the second planarization layer 113 include an inorganic material, chemical planarization polishing may be performed depending on a case. The first planarization layer 111 and the second planarization layer 113 may include both an organic material and an inorganic material.

The organic light-emitting diode OLED may be located on the second planarization layer 113 in the display area DA of the substrate 100, the organic light-emitting diode OLED including a pixel electrode 210, an intermediate layer 220, and an opposite electrode 230, the opposite electrode 230 facing the pixel electrode 210 with the intermediate layer 220 therebetween.

The pixel electrode 210 may be arranged on the second planarization layer 113. The pixel electrode 210 may include a (semi) transparent electrode or a reflective electrode. According to some example embodiments, the pixel electrode 210 may include a reflective layer and a transparent or semi-transparent electrode layer on the reflective layer, the reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. The transparent or semi-transparent electrode layer may include at least one of indium tin oxide (ITO), indium zinc oxide (IZO), zinc oxide (ZnO), indium oxide ($In_2O_3$), indium gallium oxide (IGO), and aluminum zinc oxide (AZO). According to some example embodiments, the pixel electrode 210 may have a stacked structure of ITO/Ag/ITO.

A pixel-defining layer 180 may be arranged on the second planarization layer 113. The pixel-defining layer 180 may define an emission area of a pixel by including an opening exposing a central portion of the pixel electrode 210. Also, the pixel-defining layer 180 may prevent an arc, etc. from occurring at edges of the pixel electrode 210 by increasing a distance between the edges of the pixel electrode 210 and the opposite electrode 230 over the pixel electrode 210. The pixel-defining layer 180 may include an organic insulating material such as polyimide, polyamide, an acrylic resin, BCB, HMDSO, or a phenolic resin. The pixel-defining layer 180 may be formed by a method such as spin coating.

A spacer may be arranged on the pixel-defining layer 180. The spacer may prevent the organic light-emitting diode OLED from being damaged by sagging of a mask during a manufacturing process that uses the mask. The spacer may include a single layer or a multi-layer including an organic insulating material such as polyimide, polyamide, an acrylic resin, BCB, HMDSO, or a phenolic resin. The spacer may be formed by a method such as spin coating.

The intermediate layer 220 may be arranged on a portion of the pixel electrode 210 that is exposed by the pixel-defining layer 180. The intermediate layer 220 may include an emission layer and further include functional layers under and on the emission layer, the functional layers including a hole transport layer (HTL), a hole injection layer (HIL), an electron transport layer (ETL), and an electron injection layer (EIL).

The emission layer may include an organic material including a fluorescent or phosphorous material emitting red, green, blue, or white light. The emission layer may include a low molecular weight organic material or a polymer organic material.

In the case where the emission layer includes a low molecular weight material, the intermediate layer 220 may have a structure in which an HIL, an HTL, an emission layer (EML), an ETL, an EIL, etc. are stacked in a single or a composite configuration. The intermediate layer 220 may include, as a low molecular weight material, various organic materials such as copper phthalocyanine (CuPc), N, N'-Di (naphthalene-1-yl)-N, N'-diphenyl-benzidine (NPB), or tris-8-hydroxyquinoline aluminum (Alq3). These layers may be formed by vacuum deposition.

In the case where the emission layer includes a polymer material, the intermediate layer 220 may have a structure generally including an HTL and an EML. In this case, the HTL may include poly (3,4-ethylenedioxythiophene) (PEDOT), and the EML may include a polymer material such as a polyphenylene vinylene (PPV)-based material or a polyfluorene-based material. The emission layer may be formed by screen printing, inkjet printing, laser induced thermal imaging (LITI), etc.

The pixel electrode 210 may be provided as a plurality of pixel electrodes, and the intermediate layer 220 may be arranged to correspond to each of the plurality of pixel electrodes 210. However, the embodiments are not limited thereto. The intermediate layer 220 may include a layer that is one body over the plurality of pixel electrodes 210. Various modifications may be made. According to some example embodiments, the intermediate layer 220 may be arranged to correspond to each of the plurality of pixel electrodes 210, and the functional layer(s) except for the intermediate layer 220 may be provided as one body over the plurality of pixel electrodes 210.

The opposite electrode 230 may be arranged on the intermediate layer 220. The opposite electrode 230 may be arranged on the intermediate layer 220 and may entirely cover the intermediate layer 220. The opposite electrode 230 may be arranged in the display area DA and arranged on an entire surface of the display area DA. That is, the opposite electrode 230 may be provided as one body so as to cover the plurality of pixels.

The opposite electrode 230 may include a transparent electrode or a reflective electrode. According to some example embodiments, the opposite electrode 230 may be a transparent or semi-transparent electrode and may include a metal thin layer having a small work function and including at least one of lithium (Li), calcium (Ca), lithium fluoride (LiF)/Ca, LiF/aluminum (Al), Al, silver (Ag), magnesium (Mg), and a compound thereof. Also, a transparent conductive oxide (TCO) layer may be further arranged on the metal thin layer, the TCO layer including ITO, IZO, ZnO, or $In_2O_3$.

In the case where the pixel electrode 210 includes a reflective electrode and the opposite electrode 230 includes a transparent electrode, light emitted from the intermediate layer 220 is emitted toward the opposite electrode 230 and thus the display device 1 may be a top-emission type display device. According to some example embodiments, in the case where the pixel electrode 210 includes a transparent or semi-transparent electrode and the opposite electrode 230 includes a reflective electrode, light emitted from the intermediate layer 220 is emitted toward the substrate 100 and thus the display device 1 may be a bottom-emission type display device. However, the present embodiments are not limited thereto and the display device 1 according to some example embodiments may be a dual-emission type display device that emits light in two directions including a top side and a bottom side of the display device 1.

The thin-film encapsulation layer TFE may be arranged on the opposite electrode 230 to protect the organic light-emitting diode OLED from external moisture and oxygen. The thin-film encapsulation layer TFE may include at least one organic encapsulation layer and at least one inorganic encapsulation layer. The thin-film encapsulation layer TFE may entirely cover the display area DA and extend to the peripheral area PA to cover a portion of the peripheral area PA.

The thin-film encapsulation layer TFE may include a first inorganic encapsulation layer 310, a second inorganic encapsulation layer 330, and an organic encapsulation layer 320, the second inorganic encapsulation layer 330 being arranged over the first inorganic encapsulation layer 310, and the organic encapsulation layer 320 being between the first inorganic encapsulation layer 310 and the second inorganic encapsulation layer 330.

The first inorganic encapsulation layer 310 and the second inorganic encapsulation layer 330 may include at least one inorganic material among aluminum oxide ($Al_2O_3$), titanium oxide ($TiO_2$), tantalum oxide ($Ta_2O_5$), hafnium oxide ($HfO_2$), zinc oxide ($ZnO_2$), silicon oxide ($SiO_2$), silicon nitride ($SiN_x$), and silicon oxynitride (SiON). The first inorganic encapsulation layer 310 and the second inorganic encapsulation layer 330 may include a single layer or a multi-layer including the above materials. The first inorganic encapsulation layer 310 and the second inorganic encapsulation layer 330 may include the same material or different materials.

The organic encapsulation layer 320 may include a monomer-based material or a polymer-based material. The organic encapsulation layer 320 may include polyethylene terephthalate, polyethylene naphthalate, polycarbonate, polyimide, polyethylene sulfonate, polyoxymethylene, polyacrylate, hexamethyldisiloxane, an acrylic resin (e.g. polymethylmethacrylate, polyacrylic acid, etc.) or an arbitrary combination thereof.

Figure 8A:
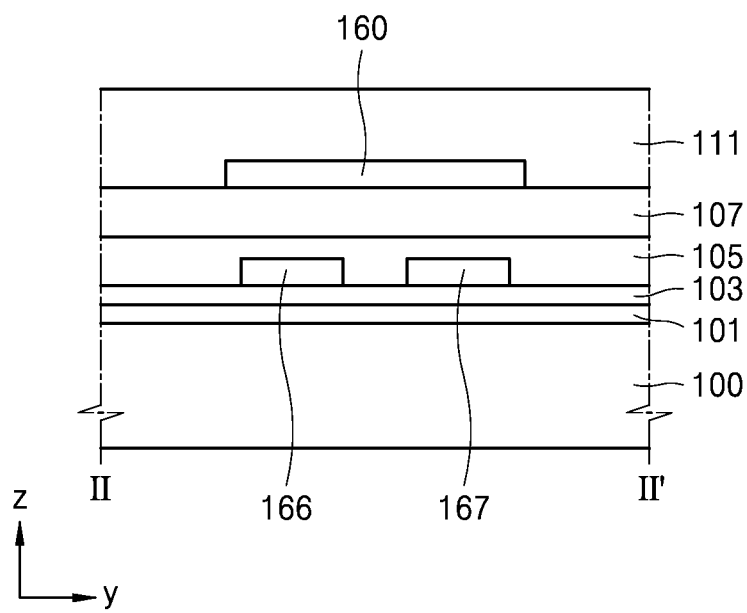
FIGS. 8A to 8C are cross-sectional views of the display device taken along the line II-II' of FIG. 6.
Figure 8B:
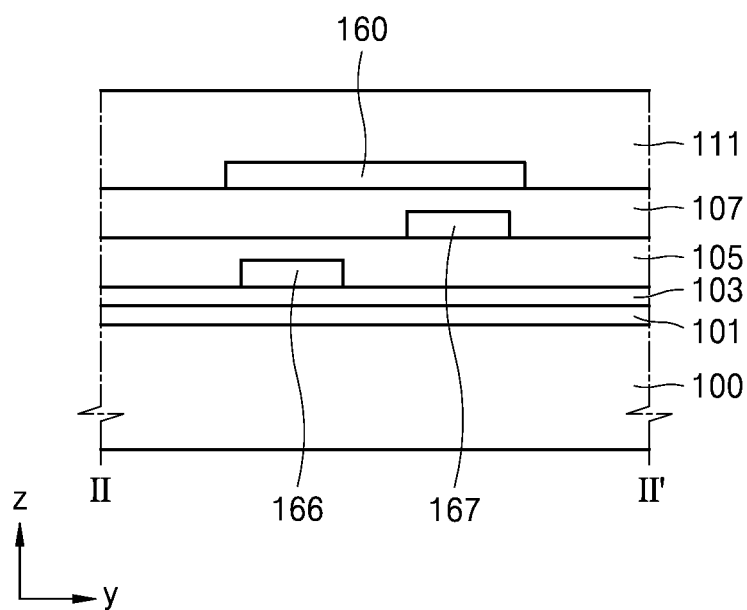
Figure 8C:
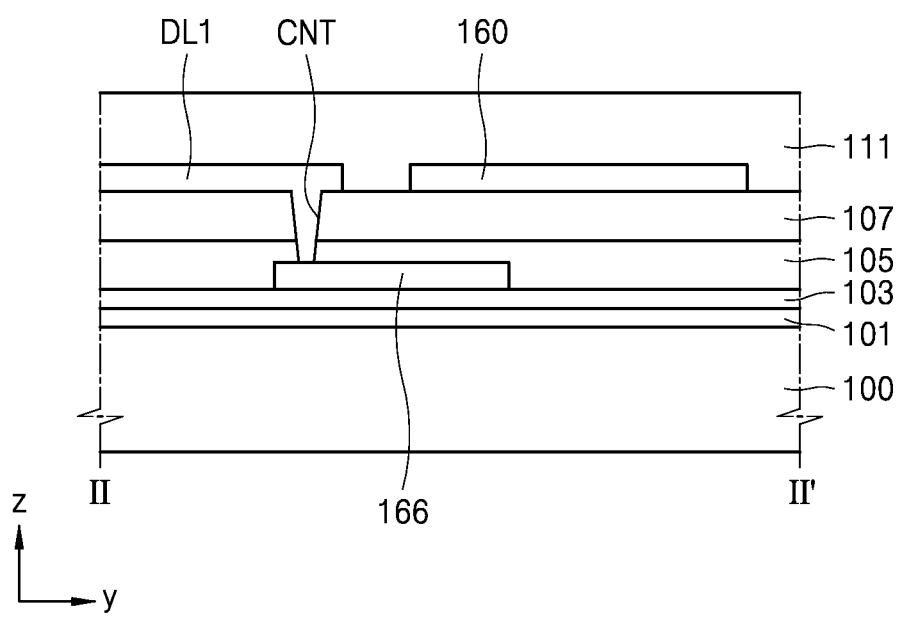

FIGS. 8A to 8C are cross-sectional views of the display device 1 taken along the line II-II' of FIG. 6. For example, FIG. 8A is a view showing that the first fan-out line 166 and the second fan-out line 167 included in the first fan-out portion 165 overlap at least a portion of the first power supply line 160 in the display device 1 according to some example embodiments, FIG. 8B is a view showing that the first fan-out line 166 and the second fan-out line 167 included in the first fan-out portion 165 are alternately arranged in the display device 1 according to some example embodiments, and FIG. 8C is a view showing that the first fan-out line 166 is electrically connected to the first data line DL1 through a contact hole CNT in the display device 1 according to an embodiment.

The buffer layer 101, the gate insulating layer 103, the first interlayer insulating layer 105, the second interlayer insulating layer 107, the first planarization layer 111, and the second planarization layer 113 each arranged in the display area DA may extend to the peripheral area PA.

Referring to FIG. 8A, the buffer layer 101 may be arranged on the substrate 100, the gate insulating layer 103 may be arranged on the buffer layer 101, and the first fan-out line 166 and the second fan-out line 167 may be arranged on the gate insulating layer 103. The first fan-out line 166 and the second fan-out line 167 may provide a data signal to each pixel in the first display area DA1 through the first data line DL1. According to some example embodiments, the first fan-out line 166 and the second fan-out line 167 may include the same material as that of the gate electrode 136.

The first interlayer insulating layer 105 may be arranged on the first fan-out line 166 and the second fan-out line 167, the second interlayer insulating layer 107 may be arranged on the first interlayer insulating layer 105, and the first power supply line 160 may be arranged on the second interlayer insulating layer 107. The first power supply line 160 may provide the first power voltage to each pixel through the driving voltage line PL. According to some example embodiments, the first power supply line 160 may include the same material as those of the source electrode 137 and the drain electrode 138. The first planarization layer 111 may be arranged on the first power supply line 160.

The first fan-out line 166 may be insulated from the first power supply line 160 by the first interlayer insulating layer 105 and the second interlayer insulating layer 107. The first fan-out line 166 may overlap at least a portion of the first power supply line 160 over the substrate 100.

The second fan-out line 167 may be insulated from the first power supply line 160 by the first interlayer insulating layer 105 and the second interlayer insulating layer 107. The second fan-out line 167 may overlap at least a portion of the first power supply line 160 over the substrate 100.

Referring to FIG. 8B, the first fan-out portion 165 may include the first fan-out line 166 and the second fan-out line 167 respectively arranged on different layers over the substrate 100. The first fan-out line 166 and the second fan-out line 167 may be alternately arranged. For example, the first fan-out portion 165 may include the first fan-out line 166 arranged on the gate insulating layer 103, and the second fan-out line 167 arranged on the first interlayer insulating layer 105. The first fan-out line 166 and the second fan-out line 167 may be alternately arranged over the substrate 100. Because the first fan-out line 166 and the second fan-out line 167 may be alternately and respectively arranged on different layers, an area of the peripheral area PA, that is, a dead space may be reduced. Though it is shown in FIG. 8B that the first fan-out line 166 is arranged on the gate insulating layer 103, and the second fan-out line 167 is arranged on the first interlayer insulating layer 105, the embodiments are not limited thereto. According to some example embodiments, the first fan-out line 166 may be arranged on the first interlayer insulating layer 105, and the second fan-out line 167 may be arranged on the gate insulating layer 103.

Referring to FIG. 8C, the buffer layer 101 may be arranged on the substrate 100, the gate insulating layer 103 may be arranged on the buffer layer 101, and the first fan-out line 166 may be arranged on the gate insulating layer 103. The first interlayer insulating layer 105 may be arranged on the first fan-out line 166, the second interlayer insulating layer 107 may be arranged on the first interlayer insulating layer 105, and the first data line DL1 and the first power supply line 160 may be arranged on the second interlayer insulating layer 107. The first data line DL1 may be electrically connected to the first fan-out line 166 through a contact hole CNT passing through the first interlayer insulating layer 105 and the second interlayer insulating layer 107. The first power supply line 160 may overlap at least a portion of the first fan-out line 166 with the first interlayer insulating layer 105 and the second interlayer insulating layer 107 therebetween.

Figure 9A:
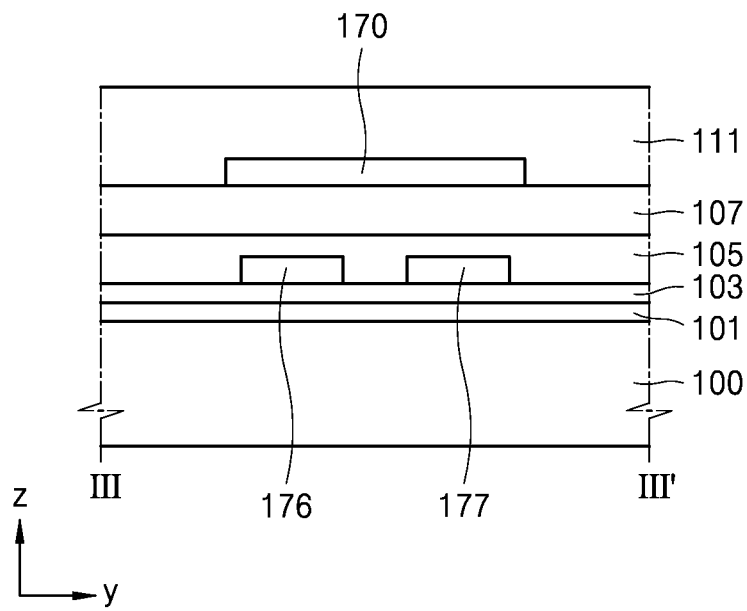
FIGS. 9A and 9B are cross-sectional views of the display device taken along the line III-III' of FIG. 6.
Figure 9B:
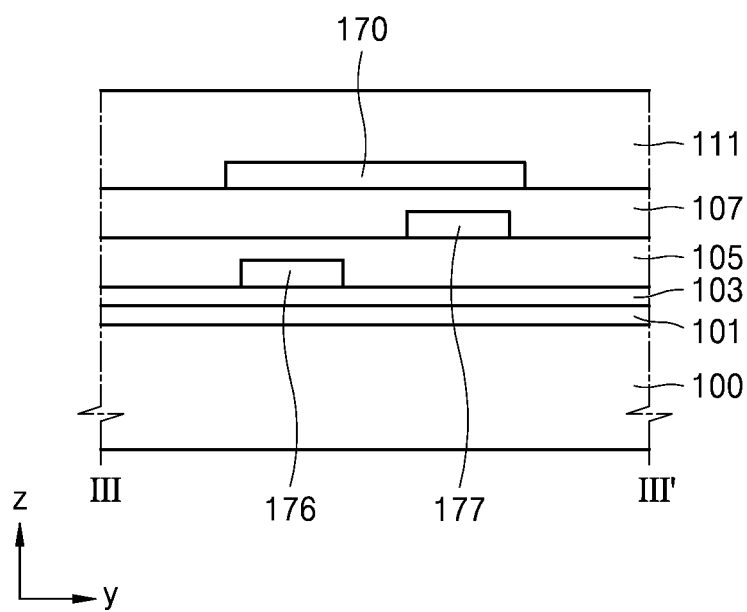

FIGS. 9A and 9B are cross-sectional views of the display device 1 taken along the line III-III' of FIG. 6. For example, FIG. 9A is a view showing that the third fan-out line 176 and the fourth fan-out line 177 included in the second fan-out portion 175 overlap at least a portion of the second power supply line 170 in the display device 1 according to some example embodiments, and FIG. 9B is a view showing that the third fan-out line 176 and the fourth fan-out line 177 included in the second fan-out portion 175 are alternately arranged in the display device 1 according to an embodiment.

Referring to FIG. 9A, the buffer layer 101 may be arranged on the substrate 100, the gate insulating layer 103 may be arranged on the buffer layer 101, and the third fan-out line 176 and the fourth fan-out line 177 may be arranged on the gate insulating layer 103. The third fan-out line 176 and the fourth fan-out line 177 may provide a data signal to each pixel in the second display area DA2 through the second data line DL2. According to some example embodiments, the third fan-out line 176 and the fourth fan-out line 177 may include the same material as that of the gate electrode 136.

The first interlayer insulating layer 105 may be arranged on the third fan-out line 176 and the fourth fan-out line 177, the second interlayer insulating layer 107 may be arranged on the first interlayer insulating layer 105, and the second power supply line 170 may be arranged on the second interlayer insulating layer 107. The second power supply line 170 may provide the second power voltage to each pixel. According to some example embodiments, the second power supply line 170 may include the same material as those of the source electrode 137 and the drain electrode 138. The first planarization layer 111 may be arranged on the second power supply line 170.

The third fan-out line 176 may be insulated from the second power supply line 170 by the first interlayer insulating layer 105 and the second interlayer insulating layer 107. The third fan-out line 176 may overlap at least a portion of the second power supply line 170 over the substrate 100.

The fourth fan-out line 177 may be insulated from the second power supply line 170 by the first interlayer insulating layer 105 and the second interlayer insulating layer 107. The fourth fan-out line 177 may overlap at least a portion of the second power supply line 170 over the substrate 100.

Referring to FIG. 9B, the second fan-out portion 175 may include the third fan-out line 176 and the fourth fan-out line 177 respectively arranged on different layers over the substrate 100. The third fan-out line 176 and the fourth fan-out line 177 may be alternately arranged. For example, the second fan-out portion 175 may include the third fan-out line 176 arranged on the gate insulating layer 103, and the fourth fan-out line 177 arranged on the first interlayer insulating layer 105. The third fan-out line 176 and the fourth fan-out line 177 may be alternately arranged over the substrate 100. Because the third fan-out line 176 and the fourth fan-out line 177 are alternately and respectively arranged on different layers, an area of the peripheral area PA, that is, a dead space may be reduced. Though it is shown in FIG. 9B that the third fan-out line 176 is arranged on the gate insulating layer 103, and the fourth fan-out line 177 is arranged on the first interlayer insulating layer 105, the embodiments are not limited thereto. According to some example embodiments, the third fan-out line 176 may be arranged on the first interlayer insulating layer 105, and the fourth fan-out line 177 may be arranged on the gate insulating layer 103.

Figure 10:
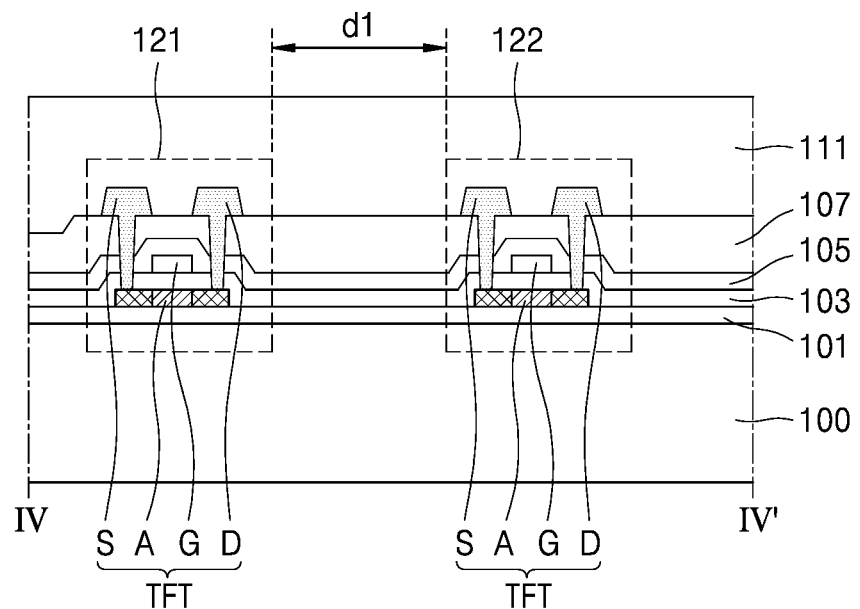
FIG. 10 is a cross-sectional view of the display device taken along the line IV-IV' of FIG. 6.
Figure 11:
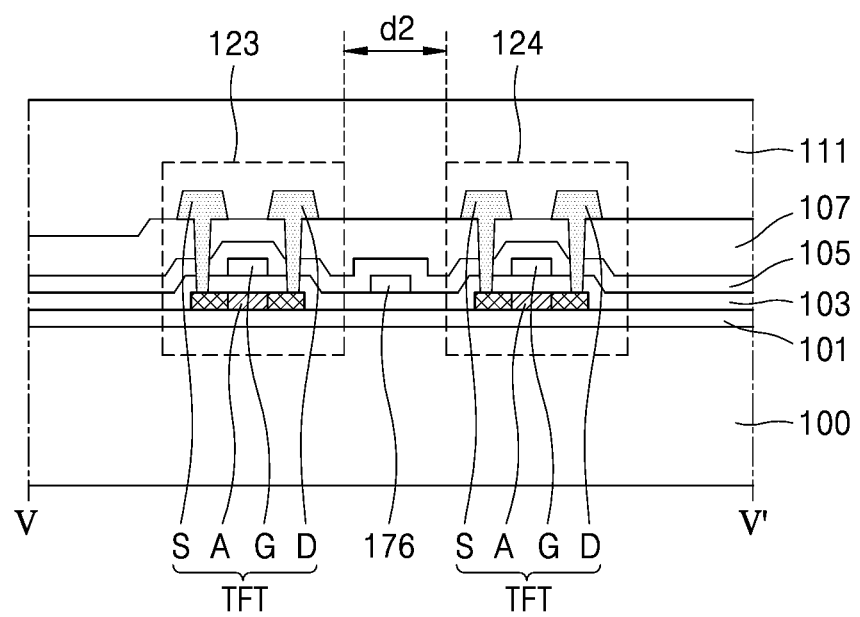
FIG. 11 is a cross-sectional view of the display device taken along the line V-V' of FIG. 6.

FIG. 10 is a cross-sectional view of the display device 1 taken along the line IV-IV' of FIG. 6, and FIG. 11 is a cross-sectional view of the display device 1 taken along the line V-V' of FIG. 6. For example, FIGS. 10 and 11 are views for explaining a separation interval between the first sub-driving circuit 121 and the second sub-driving circuit 122 included in the driving circuit 120 and a separation interval between the third sub-driving circuit 123 and the fourth sub-driving circuit 124 included in the driving circuit 120 in the display device 1 according to an embodiment.

Referring to FIG. 10, the driving circuit 120 may include the first sub-driving circuit 121 and the second sub-driving circuit 122. Each of the first sub-driving circuit 121 and the second sub-driving circuit 122 may include thin film transistors TFT and wirings connected to the thin film transistors TFT. The thin film transistor TFT may be formed during the same process as a process of forming the thin film transistor TFT of the pixel circuit PC.

The first sub-driving circuit 121 and the second sub-driving circuit 122 may be spaced apart from each other. For example, the first sub-driving circuit 121 and the second sub-driving circuit 122 may be spaced apart from each other by a first distance d1 over the substrate 100.

Referring to FIG. 11, the driving circuit 120 may include the third sub-driving circuit 123 and the fourth sub-driving circuit 124. Each of the third sub-driving circuit 123 and the fourth sub-driving circuit 124 may include thin film transistors TFT and wirings connected to the thin film transistors TFT.

The third sub-driving circuit 123 and the fourth sub-driving circuit 124 may be spaced apart from each other. For example, the third sub-driving circuit 123 and the fourth sub-driving circuit 124 may be spaced apart from each other by a second distance d2 over the substrate 100. The third fan-out line 176 may be arranged between the third sub-driving circuit 123 and the fourth sub-driving circuit 124, the third fan-out line 176 being connected to the second data line DL2 arranged in the second display area DA2.

The first distance d1, which is the separation distance between the first sub-driving circuit 121 and the second sub-driving circuit 122, may be greater than the second distance d2, which is the separation distance between the third sub-driving circuit 123 and the fourth sub-driving circuit 124. For example, the separation distance between the sub-driving circuits arranged in the peripheral area PA corresponding to the first display area DA1 and the second display area DA2 may gradually increase toward the peripheral area PA corresponding to the first display area DA1 from the peripheral area PA corresponding to the second display area DA2.

To resolve a problem that a dead space of a corner portion is greater than a dead space of a straight portion in a display device according to the related art, some example embodiments provides a display device in which, because a power supply line overlaps a fan-out line of a corner portion, a peripheral area is minimized or reduced and thus a space may be efficiently used.

According to embodiments having the above-described configuration, a display device including a minimized peripheral area in which a power supply line overlaps a fan-out line of a corner portion, may be implemented. However, the scope of embodiments according to the present disclosure are not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display device comprising:
    a substrate including a display area and a peripheral area outside the display area, the display area including a first display area and a second display area;
    a first fan-out portion in a portion of the peripheral area outside the first display area;
    a second fan-out portion outside the first fan-out portion;
    a first power supply line in the peripheral area corresponding to one side of the display area and overlapping at least a portion of the first fan-out portion; and
    a second power supply line in the peripheral area outside the display area and overlapping at least a portion of the second fan-out portion,
    wherein the display area includes a round-type corner portion,
    wherein the first power supply line is configured to provide a first power voltage to a plurality of pixels,
    wherein the second power supply line is configured to provide a second power voltage to the plurality of pixels,
    wherein the first fan-out portion includes a first fan-out line and a second fan-out line,
    wherein the second fan-out portion includes a third fan-out line and a fourth fan-out line,
    wherein the first fan-out line and the third fan-out line are each configured to provide a data signal to the plurality of pixels,
    wherein the first power supply line and the first fan-out line overlap in the round-type corner portion.

2. The display device of claim 1, further comprising a driving circuit between the first fan-out portion and the second fan-out portion corresponding to the first display area, and between the second display area and the second fan-out portion corresponding to the second display area.

3. The display device of claim 2, wherein the driving circuit includes a first sub-driving circuit and a second sub-driving circuit each between the first fan-out portion and the second fan-out portion and corresponding to the first display area, and
    the first sub-driving circuit and the second sub-driving circuit are spaced apart from each other by a first distance.

4. The display device of claim 3, wherein the driving circuit includes a third sub-driving circuit and a fourth sub-driving circuit each between the second display area and the second fan-out portion and corresponding to the second display area, and
    the third sub-driving circuit and the fourth sub-driving circuit are spaced apart from each other by a second distance less than the first distance.

5. The display device of claim 4, wherein the first fan-out line and the second fan-out line are respectively on different layers over the substrate, and
    the first fan-out line and the second fan-out line are alternately arranged.

6. The display device of claim 5, wherein the third fan-out line and the fourth fan-out line are respectively on different layers over the substrate, and
    the third fan-out line and the fourth fan-out line are alternately arranged.

7. The display device of claim 6, wherein the third fan-out line passes between the third sub-driving circuit and the fourth sub-driving circuit.

8. The display device of claim 6, wherein the plurality of pixels are arranged in the display area.

9. The display device of claim 8, further comprising a plurality of first data lines in the first display area and extending in a first direction,
wherein the first fan-out line and the second fan-out line are connected to the plurality of first data lines and are configured to provide a data signal to the plurality of pixels.

10. The display device of claim 9, further comprising a plurality of second data lines in the second display area and extending in the first direction,
wherein the third fan-out line and the fourth fan-out line are connected to the plurality of second data lines and are configured to provide a data signal to the plurality of pixels.

11. The display device of claim 9, further comprising a plurality of scan lines in the display area and extending in a second direction intersecting the first direction, wherein the driving circuit is configured to transfer a scan signal to each pixel through the plurality of scan lines.

12. The display device of claim 5, further comprising a thin film transistor including a semiconductor layer, a gate electrode, a source electrode, and a drain electrode, the gate electrode being insulated from the semiconductor layer, and the source electrode and the drain electrode being insulated from the gate electrode, wherein the first fan-out line includes same material as that of the gate electrode, and the first power supply line includes same material as that of the source electrode.

13. The display device of claim 12, further comprising a storage capacitor including a bottom electrode and a top electrode on the bottom electrode,
wherein the first fan-out line includes a same material as that of the bottom electrode or the top electrode.

* * * * *